(12) United States Patent
Szewerenko et al.

(10) Patent No.: US 7,417,310 B2
(45) Date of Patent: Aug. 26, 2008

(54) CIRCUIT MODULE HAVING FORCE RESISTANT CONSTRUCTION

(75) Inventors: Leland Szewerenko, Austin, TX (US); Julian Partridge, Austin, TX (US); Ron Orris, Austin, TX (US)

(73) Assignee: Entorian Technologies, LP, Austin, TX (US)

( * ) Notice: Subject to any disclaimer, the term of this patent is extended or adjusted under 35 U.S.C. 154(b) by 189 days.

(21) Appl. No.: 11/556,124

(22) Filed: Nov. 2, 2006

(65) Prior Publication Data

US 2008/0122054 A1 May 29, 2008

(51) Int. Cl.
*G06K 9/00* (2006.01)
(52) U.S. Cl. ....................... 257/696; 382/124
(58) Field of Classification Search ............ 257/696
See application file for complete search history.

(56) References Cited

U.S. PATENT DOCUMENTS

| | | |
|---|---|---|
| 3,411,122 A | 11/1968 | Schiller et al. |
| 3,436,604 A | 4/1969 | Hyltin |
| 3,654,394 A | 4/1972 | Gordon |
| 3,746,934 A | 7/1973 | Stein |
| 3,766,439 A | 10/1973 | Isaacson |
| 3,772,776 A | 11/1973 | Weisenburger |
| 3,806,767 A | 4/1974 | Lehrfeld |
| 3,983,547 A | 9/1976 | Almasi |
| 4,079,511 A | 3/1978 | Grabbe |
| 4,288,841 A | 9/1981 | Gogal |
| 4,381,421 A | 4/1983 | Coats et al. |
| 4,406,508 A | 9/1983 | Sadigh-Behzadi |
| 4,420,794 A | 12/1983 | Anderson |
| 4,437,235 A | 3/1984 | Burns |
| 4,513,368 A | 4/1985 | Houseman |
| 4,587,596 A | 5/1986 | Bunnell |
| 4,645,944 A | 2/1987 | Uya |

(Continued)

FOREIGN PATENT DOCUMENTS

DE 004215467 A1 11/1992

(Continued)

OTHER PUBLICATIONS

U.S. Appl. No. 10/400,309, filed Mar. 27, 2003.

(Continued)

*Primary Examiner*—Evan Pert
*Assistant Examiner*—Krista Soderholm
(74) *Attorney, Agent, or Firm*—Fish & Richardson P.C.

(57) ABSTRACT

Impact resistant circuit modules are disclosed for enclosing a die having a sensor area. Preferred modules include a flexible circuit and a die coupled thereto. The flexible circuit is preferably folded over compressible material to help absorb applied forces. A gap may be provided between sides of the die and the compressible material to help prevent peeling. A metal reinforcing layer may be bonded to the back of the die. A low modulus material including a patterned gap underneath the die may be used to absorb forces. A dry film adhesive may be placed between at least part of the upper surface of the die and the flexible circuit, preferably to provide further point impact resistance and protection. High and low modulus material may be combined in ruggedizing structures. Consumer devices employing such circuit modules are also taught, as well as module construction methods.

43 Claims, 8 Drawing Sheets

U.S. PATENT DOCUMENTS

| | | | |
|---|---|---|---|
| 4,696,525 A | 9/1987 | Coller et al. | |
| 4,712,129 A | 12/1987 | Orcutt | |
| 4,722,691 A | 2/1988 | Gladd et al. | |
| 4,733,461 A | 3/1988 | Nakano | |
| 4,758,875 A | 7/1988 | Fujisawa et al. | |
| 4,763,188 A | 8/1988 | Johnson | |
| 4,821,007 A | 4/1989 | Fields et al. | |
| 4,823,234 A | 4/1989 | Konishi et al. | |
| 4,833,568 A | 5/1989 | Berhold | |
| 4,839,717 A | 6/1989 | Phy et al. | |
| 4,862,249 A | 8/1989 | Carlson | |
| 4,884,237 A | 11/1989 | Mueller et al. | |
| 4,891,789 A | 1/1990 | Quattrini et al. | |
| 4,903,169 A | 2/1990 | Kitagawa et al. | |
| 4,911,643 A | 3/1990 | Perry et al. | |
| 4,953,060 A | 8/1990 | Lauffer et al. | |
| 4,956,694 A | 9/1990 | Eide | |
| 4,983,533 A | 1/1991 | Go | |
| 4,985,703 A | 1/1991 | Kaneyama | |
| 5,012,323 A | 4/1991 | Farnworth | |
| 5,016,138 A | 5/1991 | Woodman | |
| 5,034,350 A | 7/1991 | Marchisi | |
| 5,041,015 A | 8/1991 | Travis | |
| 5,041,902 A | 8/1991 | McShane | |
| 5,050,039 A | 9/1991 | Edfors | |
| 5,057,903 A | 10/1991 | Olla | |
| 5,064,782 A | 11/1991 | Nishiguchi | |
| 5,068,708 A | 11/1991 | Newman | |
| 5,081,067 A | 1/1992 | Shimizu et al. | |
| 5,099,393 A | 3/1992 | Bentlage et al. | |
| 5,104,820 A | 4/1992 | Go et al. | |
| 5,117,282 A | 5/1992 | Salatino | |
| 5,122,862 A | 6/1992 | Kajihara et al. | |
| 5,138,430 A | 8/1992 | Gow, 3rd et al. | |
| 5,138,434 A | 8/1992 | Wood et al. | |
| 5,158,912 A | 10/1992 | Kellerman et al. | |
| 5,159,434 A | 10/1992 | Kohno et al. | |
| 5,159,535 A | 10/1992 | Desai et al. | |
| 5,168,926 A | 12/1992 | Watson et al. | |
| 5,198,888 A | 3/1993 | Sugano et al. | |
| 5,198,965 A | 3/1993 | Curtis et al. | |
| 5,214,307 A | 5/1993 | Davis | |
| 5,219,794 A | 6/1993 | Satoh et al. | |
| 5,222,014 A | 6/1993 | Lin | |
| 5,224,023 A | 6/1993 | Smith et al. | |
| 5,229,641 A | 7/1993 | Katayama | |
| 5,229,916 A | 7/1993 | Frankeny et al. | |
| 5,239,198 A | 8/1993 | Lin et al. | |
| 5,240,588 A | 8/1993 | Uchida | |
| 5,241,454 A | 8/1993 | Ameen et al. | |
| 5,243,133 A | 9/1993 | Engle et al. | |
| 5,247,423 A | 9/1993 | Lin et al. | |
| 5,252,855 A | 10/1993 | Ogawa et al. | |
| 5,252,857 A | 10/1993 | Kane et al. | |
| 5,259,770 A | 11/1993 | Bates et al. | |
| 5,261,068 A | 11/1993 | Gaskins et al. | |
| 5,262,927 A | 11/1993 | Chia et al. | |
| 5,276,418 A | 1/1994 | Klosowiak et al. | |
| 5,281,852 A | 1/1994 | Normington | |
| 5,289,062 A | 2/1994 | Wyland | |
| 5,289,346 A | 2/1994 | Carey et al. | |
| 5,313,097 A | 5/1994 | Haj-Ali-Ahmadi et al. | |
| 5,337,388 A | 8/1994 | Jacobowitz et al. | |
| 5,343,366 A | 8/1994 | Cipolla et al. | |
| 5,345,205 A | 9/1994 | Kornrumpf | |
| 5,347,159 A | 9/1994 | Khandros et al. | |
| 5,347,428 A | 9/1994 | Carson et al. | |
| 5,357,478 A | 10/1994 | Kikuda et al. | |
| 5,361,228 A | 11/1994 | Adachi et al. | |
| 5,362,656 A | 11/1994 | McMahon | |
| 5,375,041 A | 12/1994 | McMahon | |
| 5,384,690 A | 1/1995 | Davis et al. | |
| 5,386,341 A | 1/1995 | Olson et al. | |
| 5,394,303 A | 2/1995 | Yamaji | |
| 5,396,573 A | 3/1995 | Ecker et al. | |
| 5,397,916 A | 3/1995 | Normington | |
| 5,428,190 A | 6/1995 | Stopperan | |
| 5,432,630 A | 7/1995 | Lebby et al. | |
| 5,438,224 A | 8/1995 | Papageorge et al. | |
| 5,448,511 A | 9/1995 | Paurus et al. | |
| 5,477,082 A | 12/1995 | Buckley, III et al. | |
| 5,484,959 A | 1/1996 | Burns | |
| 5,502,333 A | 3/1996 | Bertin et al. | |
| 5,509,197 A | 4/1996 | Stone | |
| 5,516,989 A | 5/1996 | Uedo et al. | |
| 5,523,619 A | 6/1996 | McAllister et al. | |
| 5,523,695 A | 6/1996 | Lin | |
| 5,572,065 A | 11/1996 | Burns | |
| 5,588,205 A | 12/1996 | Roane | |
| 5,594,275 A | 1/1997 | Kwon et al. | |
| 5,610,833 A | 3/1997 | Chang et al. | |
| 5,612,570 A | 3/1997 | Eide et al. | |
| 5,620,782 A | 4/1997 | Davis et al. | |
| 5,631,193 A | 5/1997 | Burns | |
| 5,642,055 A | 6/1997 | Difrancesco | |
| 5,644,839 A | 7/1997 | Stone | |
| 5,646,446 A | 7/1997 | Nicewarner, Jr. et al. | |
| 5,654,877 A | 8/1997 | Burns | |
| 5,657,537 A | 8/1997 | Saia et al. | |
| 5,677,569 A | 10/1997 | Choi et al. | |
| 5,717,556 A | 2/1998 | Yanagida | |
| 5,729,894 A | 3/1998 | Rostoker et al. | |
| 5,744,827 A | 4/1998 | Jeong et al. | |
| 5,751,553 A | 5/1998 | Clayton | |
| 5,763,296 A | 6/1998 | Casati et al. | |
| 5,764,497 A | 6/1998 | Mizumo et al. | |
| 5,776,797 A | 7/1998 | Nicewarner, Jr. et al. | |
| 5,778,522 A | 7/1998 | Burns | |
| 5,783,464 A | 7/1998 | Burns | |
| 5,789,815 A | 8/1998 | Tessier et al. | |
| 5,801,439 A | 9/1998 | Fujisawa et al. | |
| 5,804,870 A | 9/1998 | Burns | |
| 5,805,422 A | 9/1998 | Otake et al. | |
| 5,835,988 A | 11/1998 | Ishii | |
| 5,841,721 A | 11/1998 | Kwon et al. | |
| 5,852,326 A | 12/1998 | Khandros et al. | |
| 5,869,353 A | 2/1999 | Levy et al. | |
| 5,895,969 A | 4/1999 | Masuda et al. | |
| 5,895,970 A | 4/1999 | Miyoshi et al. | |
| 5,899,705 A | 5/1999 | Akram | |
| 5,917,709 A | 6/1999 | Johnson et al. | |
| 5,922,061 A | 7/1999 | Robinson | |
| 5,925,934 A | 7/1999 | Lim | |
| 5,926,369 A | 7/1999 | Ingraham et al. | |
| 5,933,712 A | 8/1999 | Bernhardt et al. | |
| 5,949,657 A | 9/1999 | Karabatsos | |
| 5,953,215 A | 9/1999 | Karabatsos | |
| 5,959,839 A | 9/1999 | Gates | |
| 5,963,427 A | 10/1999 | Bolleson | |
| 5,973,395 A | 10/1999 | Suzuki et al. | |
| 5,995,370 A | 11/1999 | Nakamori | |
| 6,002,167 A | 12/1999 | Hatano et al. | |
| 6,002,589 A | 12/1999 | Perino et al. | |
| 6,013,948 A | 1/2000 | Akram et al. | |
| 6,014,316 A | 1/2000 | Eide | |
| 6,028,352 A | 2/2000 | Eide | |
| 6,028,365 A | 2/2000 | Akram et al. | |
| 6,034,878 A | 3/2000 | Osaka et al. | |
| 6,040,624 A | 3/2000 | Chambers et al. | |
| 6,072,233 A | 6/2000 | Corisis et al. | |
| 6,084,293 A | 7/2000 | Ohuchi | |
| 6,084,294 A | 7/2000 | Tomita | |
| 6,084,778 A | 7/2000 | Malhi | |
| 6,097,087 A | 8/2000 | Farnworth et al. | |

| | | | | | | |
|---|---|---|---|---|---|---|
| 6,102,710 | A | 8/2000 | Beilin et al. | 6,514,793 | B2 | 2/2003 | Isaak |
| 6,111,761 | A | 8/2000 | Peana et al. | 6,522,018 | B1 | 2/2003 | Tay et al. |
| 6,114,763 | A | 9/2000 | Smith | 6,528,870 | B2 | 3/2003 | Fukatsu et al. |
| 6,121,676 | A | 9/2000 | Solberg | 6,532,162 | B2 | 3/2003 | Schoenborn |
| RE36,916 | E | 10/2000 | Moshayedi | 6,538,895 | B2 | 3/2003 | Worz et al. |
| 6,130,477 | A | 10/2000 | Chen et al. | 6,549,413 | B2 | 4/2003 | Karnezos et al. |
| 6,157,541 | A | 12/2000 | Hacke | 6,552,910 | B1 | 4/2003 | Moon et al. |
| 6,165,817 | A | 12/2000 | Akram | 6,559,521 | B2 | 5/2003 | Tuttle |
| 6,172,874 | B1 | 1/2001 | Bartilson | 6,560,117 | B2 | 5/2003 | Moon |
| 6,178,093 | B1 | 1/2001 | Bhatt et al. | 6,572,387 | B2 | 6/2003 | Burns et al. |
| 6,186,106 | B1 | 2/2001 | Glovatsky | 6,576,992 | B1 | 6/2003 | Cady et al. |
| 6,187,652 | B1 | 2/2001 | Chou et al. | 6,588,095 | B2 | 7/2003 | Pan |
| 6,205,654 | B1 | 3/2001 | Burns | 6,590,282 | B1 | 7/2003 | Wang et al. |
| 6,208,521 | B1 | 3/2001 | Nakatsuka | 6,600,222 | B1 | 7/2003 | Levardo |
| 6,218,731 | B1 | 4/2001 | Huang et al. | 6,608,763 | B1 | 8/2003 | Burns et al. |
| 6,222,737 | B1 | 4/2001 | Ross | 6,614,664 | B2 | 9/2003 | Lee |
| 6,225,688 | B1 | 5/2001 | Kim et al. | 6,617,510 | B2 | 9/2003 | Schreiber et al. |
| 6,233,650 | B1 | 5/2001 | Johnson et al. | 6,620,651 | B2 | 9/2003 | He et al. |
| 6,234,820 | B1 | 5/2001 | Perino et al. | 6,624,507 | B1 | 9/2003 | Nguyen et al. |
| 6,236,565 | B1 | 5/2001 | Gordon | 6,627,984 | B2 | 9/2003 | Bruce et al. |
| 6,262,895 | B1 | 7/2001 | Forthun | 6,646,333 | B1 | 11/2003 | Hogerl |
| 6,265,660 | B1 | 7/2001 | Tandy | 6,657,134 | B2 | 12/2003 | Spielberger et al. |
| 6,265,766 | B1 | 7/2001 | Moden | 6,660,561 | B2 | 12/2003 | Forthun |
| 6,266,252 | B1 | 7/2001 | Karabatsos | 6,670,700 | B1 | 12/2003 | Hashimoto |
| 6,271,058 | B1 | 8/2001 | Yoshida | 6,673,651 | B2 | 1/2004 | Ohuchi et al. |
| 6,272,741 | B1 | 8/2001 | Kennedy et al. | 6,677,670 | B2 | 1/2004 | Kondo |
| 6,281,577 | B1 | 8/2001 | Oppermann et al. | 6,683,377 | B1 | 1/2004 | Shim et al. |
| 6,285,560 | B1 | 9/2001 | Lyne | 6,689,634 | B1 | 2/2004 | Lyne |
| 6,288,907 | B1 | 9/2001 | Burns | 6,690,584 | B2 | 2/2004 | Uzuka et al. |
| 6,300,679 | B1 | 10/2001 | Mukerji et al. | 6,699,730 | B2 | 3/2004 | Kim et al. |
| 6,303,981 | B1 | 10/2001 | Moden | 6,707,148 | B1 | 3/2004 | Mostafazedeh et al. |
| 6,310,392 | B1 | 10/2001 | Burns | 6,707,684 | B1 | 3/2004 | Andric et al. |
| 6,313,998 | B1 | 11/2001 | Kledzik | 6,709,893 | B2 | 3/2004 | Moden et al. |
| 6,316,825 | B1 | 11/2001 | Park et al. | 6,724,076 | B1 | 4/2004 | Kahlisch et al. |
| 6,320,137 | B1 | 11/2001 | Bonser et al. | 6,746,894 | B2 | 6/2004 | Fee et al. |
| 6,323,060 | B1 | 11/2001 | Isaak | 6,762,495 | B1 | 7/2004 | Reyes et al. |
| 6,329,708 | B1 | 12/2001 | Komiyama | 6,762,742 | B2 | 7/2004 | Moon et al. |
| 6,336,262 | B1 | 1/2002 | Dalal et al. | 6,765,288 | B2 | 7/2004 | Damberg |
| 6,351,029 | B1 | 2/2002 | Isaak | 6,768,660 | B2 | 7/2004 | Kong et al. |
| 6,360,433 | B1 | 3/2002 | Ross | 6,773,848 | B1 | 8/2004 | Nortoft et al. |
| 6,360,935 | B1 | 3/2002 | Flake | 6,776,797 | B1 | 8/2004 | Blom |
| 6,368,896 | B2 | 4/2002 | Farnworth et al. | 6,778,404 | B1 | 8/2004 | Bolken et al. |
| 6,376,769 | B1 | 4/2002 | Chung | 6,781,240 | B2 | 8/2004 | Choi et al. |
| 6,384,339 | B1 | 5/2002 | Neuman | 6,803,651 | B1 | 10/2004 | Chiang |
| 6,392,162 | B1 | 5/2002 | Karabatsos | 6,812,567 | B2 | 11/2004 | Kim et al. |
| 6,410,857 | B1 | 6/2002 | Gonya | 6,821,029 | B1 | 11/2004 | Grung et al. |
| 6,414,384 | B1 | 7/2002 | Lo et al. | 6,833,984 | B1 | 12/2004 | Belgacem |
| 6,423,622 | B1 | 7/2002 | Chen et al. | 6,841,855 | B2 | 1/2005 | Jaeck et al. |
| 6,426,240 | B2 | 7/2002 | Isaak | 6,849,949 | B1 | 2/2005 | Lyu et al. |
| 6,426,549 | B1 | 7/2002 | Isaak | 6,867,496 | B1 | 3/2005 | Hashimoto |
| 6,426,560 | B1 | 7/2002 | Kawamura et al. | 6,869,825 | B2 | 3/2005 | Chiu |
| 6,433,418 | B1 | 8/2002 | Fujisawa et al. | 6,876,074 | B2 | 4/2005 | Kim |
| 6,437,990 | B1 | 8/2002 | Degani et al. | 6,879,047 | B1 | 4/2005 | Heo |
| 6,444,490 | B2 | 9/2002 | Bertin et al. | 6,884,653 | B2 | 4/2005 | Larson |
| 6,444,921 | B1 | 9/2002 | Wang et al. | 6,891,729 | B2 | 5/2005 | Ko et al. |
| 6,446,158 | B1 | 9/2002 | Karabatsos | 6,893,897 | B2 | 5/2005 | Sweterlitsch |
| 6,447,321 | B1 | 9/2002 | Perino et al. | 6,908,792 | B2 | 6/2005 | Bruce et al. |
| 6,449,159 | B1 | 9/2002 | Haba | 6,914,324 | B2 | 7/2005 | Rapport et al. |
| 6,452,826 | B1 | 9/2002 | Kim et al. | 6,919,626 | B2 | 7/2005 | Burns |
| 6,462,408 | B1 | 10/2002 | Wehrly, Jr. | 6,965,166 | B2 | 11/2005 | Hikita et al. |
| 6,462,412 | B2 | 10/2002 | Kamei et al. | 6,998,704 | B2 | 2/2006 | Yamazaki et al. |
| 6,462,423 | B1 | 10/2002 | Akram et al. | 7,023,701 | B2 | 4/2006 | Stocken et al. |
| 6,465,877 | B1 | 10/2002 | Farnworth et al. | 7,081,373 | B2 | 7/2006 | Roeters et al. |
| 6,465,893 | B1 | 10/2002 | Khandros et al. | 7,104,804 | B2 | 9/2006 | Batinovich |
| 6,473,308 | B2 | 10/2002 | Forthun | 7,129,571 | B2 | 10/2006 | Kang |
| 6,486,544 | B1 | 11/2002 | Hashimoto | 2001/0006252 | A1 | 7/2001 | Kim et al. |
| 6,487,078 | B2 | 11/2002 | Kledzik et al. | 2001/0013423 | A1 | 8/2001 | Dalal et al. |
| 6,489,178 | B2 | 12/2002 | Coyle et al. | 2001/0015487 | A1 | 8/2001 | Forthun |
| 6,489,687 | B1 | 12/2002 | Hashimoto | 2001/0035572 | A1 | 11/2001 | Isaak |
| 6,492,718 | B2 | 12/2002 | Ohmori | 2001/0040793 | A1 | 11/2001 | Inaba |
| 6,500,697 | B2 | 12/2002 | Ahmad | 2002/0006032 | A1 | 1/2002 | Karabatsos |
| 6,504,104 | B2 | 1/2003 | Hacke et al. | 2002/0030995 | A1 | 3/2002 | Shoji |
| 6,509,639 | B1 | 1/2003 | Lin | 2002/0044423 | A1 | 4/2002 | Primavera et al. |

| | | | |
|---|---|---|---|
| 2002/0048849 | A1 | 4/2002 | Isaak |
| 2002/0076919 | A1 | 6/2002 | Pelers et al. |
| 2002/0101261 | A1 | 8/2002 | Karabatsos |
| 2002/0114143 | A1 | 8/2002 | Morrison et al. |
| 2002/0126951 | A1 | 9/2002 | Sutherland et al. |
| 2002/0139577 | A1 | 10/2002 | Miller |
| 2002/0164838 | A1 | 11/2002 | Moon et al. |
| 2002/0180022 | A1 | 12/2002 | Emoto |
| 2003/0016710 | A1 | 1/2003 | Kamoto |
| 2003/0045025 | A1 | 3/2003 | Coyle et al. |
| 2003/0049886 | A1 | 3/2003 | Salmon |
| 2003/0081392 | A1 | 5/2003 | Cady et al. |
| 2003/0107118 | A1 | 6/2003 | Pflughaupt et al. |
| 2003/0109078 | A1 | 6/2003 | Takahashi et al. |
| 2003/0113998 | A1 | 6/2003 | Ross |
| 2003/0164551 | A1 | 9/2003 | Lee et al. |
| 2003/0168725 | A1 | 9/2003 | Warner et al. |
| 2004/0000708 | A1 | 1/2004 | Rapport et al. |
| 2004/0004281 | A1 | 1/2004 | Bai et al. |
| 2004/0021211 | A1 | 2/2004 | Damberg |
| 2004/0031972 | A1 | 2/2004 | Pflughaupt et al. |
| 2004/0045159 | A1 | 3/2004 | DiStefano et al. |
| 2004/0065963 | A1 | 4/2004 | Karnezos |
| 2004/0075991 | A1 | 4/2004 | Haba et al. |
| 2004/0099938 | A1 | 5/2004 | Kang et al. |
| 2004/0104470 | A1 | 6/2004 | Bang et al. |
| 2004/0115866 | A1 | 6/2004 | Bang et al. |
| 2004/0150107 | A1 | 8/2004 | Cha et al. |
| 2004/0157362 | A1 | 8/2004 | Beroz et al. |
| 2004/0203190 | A1 | 10/2004 | Pflughaupt et al. |
| 2004/0217461 | A1 | 11/2004 | Damberg |
| 2004/0217471 | A1 | 11/2004 | Haba |
| 2004/0238931 | A1 | 12/2004 | Haba et al. |
| 2004/0245617 | A1 | 12/2004 | Damberg et al. |
| 2004/0267409 | A1 | 12/2004 | De Lorenzo et al. |
| 2005/0018495 | A1 | 1/2005 | Bhakta et al. |
| 2005/0035440 | A1 | 2/2005 | Mohammed |
| 2005/0040508 | A1 | 2/2005 | Lee |
| 2005/0047250 | A1 | 3/2005 | Ruckerbauer et al. |
| 2005/0133897 | A1 | 6/2005 | Baek et al. |

FOREIGN PATENT DOCUMENTS

| | | |
|---|---|---|
| DE | 004214102 A1 | 12/1992 |
| EP | 0426-303 A2 | 10/1990 |
| JP | 359088863 A | 5/1984 |
| JP | 60-254762 A | 12/1985 |
| JP | 60254762 | 12/1985 |
| JP | 3641047659 A | 3/1986 |
| JP | 62-230027 A | 8/1987 |
| JP | 63-153849 A | 6/1988 |
| JP | 4-209582 A | 7/1992 |
| JP | 4-4368167 A | 12/1992 |
| JP | 60-29534 A | 2/1993 |
| JP | 2000-88921 | 3/2000 |
| JP | 2000/307828 A | 11/2000 |
| JP | 2001/077294 A | 3/2001 |
| JP | 2001/085592 A | 3/2001 |
| JP | 2001/332683 A | 11/2001 |
| JP | 2003/037246 A | 2/2003 |
| JP | 2003/086760 A | 3/2003 |
| JP | 2003/086761 A | 3/2003 |
| JP | 2003/309245 A | 10/2003 |
| JP | 2003/309247 A | 10/2003 |
| JP | 2003/347475 A | 12/2003 |
| JP | 2003/347503 A | 12/2003 |
| WO | WO9744824 | 11/1997 |
| WO | WO 03/037053 A1 | 5/2003 |

OTHER PUBLICATIONS

U.S. Appl. No. 10/435,192, filed May 9, 2003.
U.S. Appl. No. 10/453,398, filed Jun. 3, 2003.
U.S. Appl. No. 10/457,608, filed Jun. 9, 2003.
U.S. Appl. No. 10/624,097, filed Jul. 21, 2003.
U.S. Appl. No. 10/804,452, filed Mar. 19, 2004.
U.S. Appl. No. 10/814,530, filed Mar. 31, 2004.
U.S. Appl. No. 10/828,495, filed Apr. 20, 2004.
U.S. Appl. No. 10/836,855, filed Apr. 30, 2004.
U.S. Appl. No. 10/845,029, filed May 13, 2004.
U.S. Appl. No. 10/872,897, filed Jun. 21, 2004.
U.S. Appl. No. 10/913,220, filed Aug. 6, 2004.
U.S. Appl. No. 10/917,216, filed Aug. 12, 2004.
U.S. Appl. No. 10/931,828, filed Sep. 1, 2004.
U.S. Appl. No. 10/940,074, filed Sep. 14, 2004.
U.S. Appl. No. 10/956,442, filed Oct. 1, 2004.
U.S. Appl. No. 10/958,584, filed Oct. 5, 2004.
U.S. Appl. No. 10/958,924, filed Oct. 5, 2004.
U.S. Appl. No. 10/958,934, filed Oct. 5, 2004.
U.S. Appl. No. 10/963,867, filed Oct. 12, 2004.
U.S. Appl. No. 10/978,149, filed Oct. 29, 2004.
U.S. Appl. No. 11/003,168, filed Dec. 3, 2004.
U.S. Appl. No. 11/015,521, filed Dec. 17, 2004.
U.S. Appl. No. 11/039,615, filed Jan. 20, 2005.
U.S. Appl. No. 11/040,564, filed Jan. 21, 2005.
U.S. Appl. No. 11/051,815, filed Feb. 4, 2005.
U.S. Appl. No. 11/116,981, filed Apr. 28, 2005.
U.S. Appl. No. 11/131,812, filed May 18, 2005.
U.S. Appl. No. 11/173,445, filed Jul. 1, 2005.
U.S. Appl. No. 11/175,562, filed Jul. 5, 2005.
U.S. Appl. No. 11/197,267, filed Aug. 4, 2005.
U.S. Appl. No. 11/221,597, filed Sep. 7, 2005.
U.S. Appl. No. 11/258,438, filed Oct. 25, 2005.
U.S. Appl. No. 11/263,627, filed Oct. 31, 2005.
U.S. Appl. No. 11/316,505, filed Dec. 21, 2005.
U.S. Appl. No. 11/403,081, filed Apr. 12, 2006.
U.S. Appl. No. 11/411,185, filed Apr. 25, 2006.
U.S. Appl. No. 11/432,206, filed May 11, 2006.
U.S. Appl. No. 11/626,318, filed Jan. 23, 2007.
U.S. Appl. No. 11/626,316, filed Jan. 23, 2007.
Flexible Printed Circuit Technology—A Versatile Interconnection Option (Website 2 pages) Fjelstad, Joseph. Dec. 3, 2002.
Die Products: Ideal IC Packaging for Demanding Applications—Advanced packaging that's no bigger than the die itself brings together high performance and high reliability with small size and low cost. (Website 3 pages with 2 figures) Larry Gilg and Chris Windsor. Dec. 23, 2002. Published on Internet.
Tessera uZ Ball Stack Package. 4 figures that purport to be directed to the uZ—Ball Stacked Memory, Published on the Internet.
Chip Scale Review Online—An Independent Journal Dedicated to the Advancement of Chip-Scale Electronics. (Website 9 pages) Fjelstad, Joseph, Pacific Consultants L.L.C., Published Jan. 2001 on Internet.
Flexible Thinking: Examining the Flexible Circuit Tapes. (Website 2 pages) Fjelstad, Joseph, Published Apr. 20, 2000 on Internet.
Ron Bauer, Intel. "Stacked-C5P Delivers Flexibility, Reliability, and Space-Saving Capabilities", vol. 3, Spring 2002. Published on the Internet.
Tessera Technologies, Inc.—Semiconductor Intellectual Property, Chip Scale Packaging—Website pp. (3), Internet.
Tessera Introduces UZ a—Ball Stacked Memory Package for Computing and Portable Electronic Products Joyce Smaragdis, Tessera Public Relations, Sandy Skees, MCA PR (www.tessera.com/news_events/press_coverage.cfm). 2 figures that purport to be directed to the uZ a—Ball Stacked Memory Package Published Jul. 17, 2002 in San Jose, CA.
William R. Newberry, Design Techniques for Ball Grid Arrays, Xynetix Design Systems, Inc., Portland, Maine. Published on the Internet.
Chip Scale Packaging and Redistribution, Paul A. Magill. Glenn A. Rinne, J. Daniel Mis. Wayne C. Machon, Joseph W. Baggs, Unitive Electronics Inc.
Dense-Pac Microsystems, 16 Megabit High Speed CMOS SRAM DPS1M+16MKn3.
Dense-Pac Microsystems, 256 Megabyte CMOS DRAM DP3ED32MS72RW5.

Dense-Pac Microsystems, Breaking Space Barriers, 3-D Technology 1993.

Dense-Pac Microsystems, DPS512+16A3, Ceramic 512K+16 CMOS SRAM Module.

IBM Prelimanary 168 Pin SDRAM Registered DIMM Functional Description & Timing Diagrams.

3D Interconnection for Ultra-Dense Multichip Modules, Christian VAL, Thomson-CSF DCS Computer Division, Thierry Lemoine, Thomson-CSF RCM Radar Countermeasures Division.

High Density Memory Packaging Technology High Speed Imaging Applications, Dean Frew, Texas Instruments Incorporated.

Vertically-Integrated Package, Alvin Weinberg, Pacesetter, Inc. and W. Kinzy Jones, Florida International University.

1992 Proceedings, 42nd Electronic Components & Technology Conference. May 18-20, 1992.

Research Disclosure. Organic Card Device Carrier, 31318, May 1990, No. 313.

IBM Technical Disclosure Bulletin, vol. 23, No. 12. May 1981.

IBM Technical Disclosure Bulletin, vol. 20, No. 11A, Apr. 1978.

IBM Technical Disclosure Bulletin, vol. 32, No. 3B, Aug. 1989.

Orthogonal Chips Mount—A 3D Hybrid Wafer Scale Integration Technology, International Electron Device Meeting, IEDM Technical Digest, Washington, D.C., Dec. 6-9, 1987.

PCT/US2006/017015, International Search Report and Written Opinion dated Oct. 17, 2006.

PCT/US2005/013345, International Preliminary Report on Patentability dated Nov. 2, 2006.

PCT/US2005/016764, International Preliminary Report on Patentability dated Nov. 23, 2006.

PCT/US2005/010756, International Search Report and Written Opinion dated Oct. 12, 2006.

PCT/US2005/010756, International Preliminary Report on Patentability dated Apr. 12, 2007.

PCT/US2005/039307, International Search Report and Written Opinion dated Sep. 26, 2006.

PCT/US2005/013336, International Preliminary Report on Patentability dated Nov. 9, 2006.

Howard W. Markstein, Western Editor, Rigid-Flex: A Maturing Technology dated Feb. 1996, Electronic Packaging & Production.

Design Requirements for Outlines of Solid State and Related Products, Ball Grid Array Package (BGA), Sep. 2005, Jedec Publication 95.

William R. Newberry, Xynetix Design Systems, Inc., Design Techniques for Ball Grid Arrays, 1997 published on the internet.

CIRCUIT MODULE HAVING FORCE RESISTANT CONSTRUCTION

FIELD

The present disclosure relates to enclosures or packaging for semiconductor dies, and especially to packaging sensors for relief of stresses associated with their use.

BACKGROUND

Many sensors, including fingerprint sensors, exist as part of a semiconductor die having micro-component transducers such as antennas. One popular fingerprint sensor is presented on a semiconductor die as an array of radio frequency (RF) antennas that receive low power transmissions directed to reflect from a user's finger presented above the array. One typical application of such a sensor, for example, is a laptop computer provided with a fingerprint sensor pad at one external surface. The laptop or other device may employ, mounted near an outer surface, a fingerprint scanner (or other biometric device), such as the "FingerLoc® 8600" (AFS8600) manufactured by AuthenTec. In such a case, the die may have a sensing area that comprises an RF fingerprint sensing array, which may be externally exposed as a sensor pad. The user presses a designated finger or thumb downward on the pad to identify themselves to the device and gain access.

Pressing a finger on a sensor pad often causes mechanical force to be applied to the sensor. In some cases, such force may overstress the structure of the sensor and package by, for example, bending the die or bending the package sufficiently to crack or break conductive layers within the package, causing electrical failure. Because the sensor pad is presented at an exposed surface, it may be subjected to other forces such as being struck or squeezed by common scenarios like the device being hand-carried, dropped, or having object stacked on top of it.

Some previous sensor packages provide compressible material beneath the sensor array to help absorb such forces. However, such schemes typically suffer from a variety of problems. One problem is that a semiconductor die containing the sensor or sensor array may be bent by the stress and may fail or crack as a result. Another problem is that downward forces may cause the sensor die to peel away from the flexible circuit to which it is mounted. Still further, the forces applied to the sensor array may cause mechanical stress and failure at other parts of the sensor package, such as conductive traces, or output connection contacts, for example.

What is needed are semiconductor circuit modules or packages that enable semiconductor die or other sensor transducers to be presented along an outer surface of the package while still absorbing forces applied to the sensor sufficiently to prevent failure.

SUMMARY

This specification describes technologies relating to enclosures or packaging for semiconductor dies, and especially to packaging sensors for relief of stresses associated with their use. In general, one aspect of the subject matter herein is a circuit module including a flexible circuit and a die electrically coupled to the flexible circuit. The die has a sensing area. The flexible circuit is preferably folded over an interior area, which is provided with compressible material to help absorb applied forces. In some preferred embodiment, a gap may be provided between at least one side of the die and the compressible material to help prevent the die peeling away from the flexible circuit, In some embodiments, the die may have a reinforcing layer or a high modulus material attached to the bottom surface or disposed about the bottom surface and sides of the die in a manner sufficient to at least partially protect the die from flexural loads. Preferably, the reinforcing layer has a coefficient of thermal expansion closely matching that of the die. Low modulus material may also be disposed in the interior region and about the high modulus material in a manner sufficient to at least partially absorb compressive loads applied to the die.

In some embodiments, the flexible circuit is preferably folded over an interior area, which is provided with compressible material to help absorb applied forces. Low modulus material compressible material may be used including a patterned gap formed in the low modulus material under the bottom surface of the die. Additionally, a dry film adhesive may be placed between at least part of the upper surface of the die and the flexible circuit, preferably to provide further point impact resistance and protection.

Consumer devices such as, for example, laptop computers, personal digital assistants (PDAS), mobile phones, or other such devices, may be provided with a circuit module 10. The module preferably is housed to place the sensing area of the die along the outer surface or skin of the product, although some variants may have another covering, such as an access panel, above the sensor circuit module. Some devices have a security access system programmed to receive identifying data from a sensor on the circuit module and provide device access based on the identity or lack of an identifying match. Other devices may use the sensor data for other purposes.

The details of one or more embodiments of the invention are set forth in the accompanying drawings and the description below. Other features, aspects, and advantages of the invention will become apparent from the description, the drawings, and the claims.

BRIEF DESCRIPTION OF THE DRAWINGS

Like reference numbers and designations in the various drawings indicate like elements.

DETAILED DESCRIPTION

Figure 1:
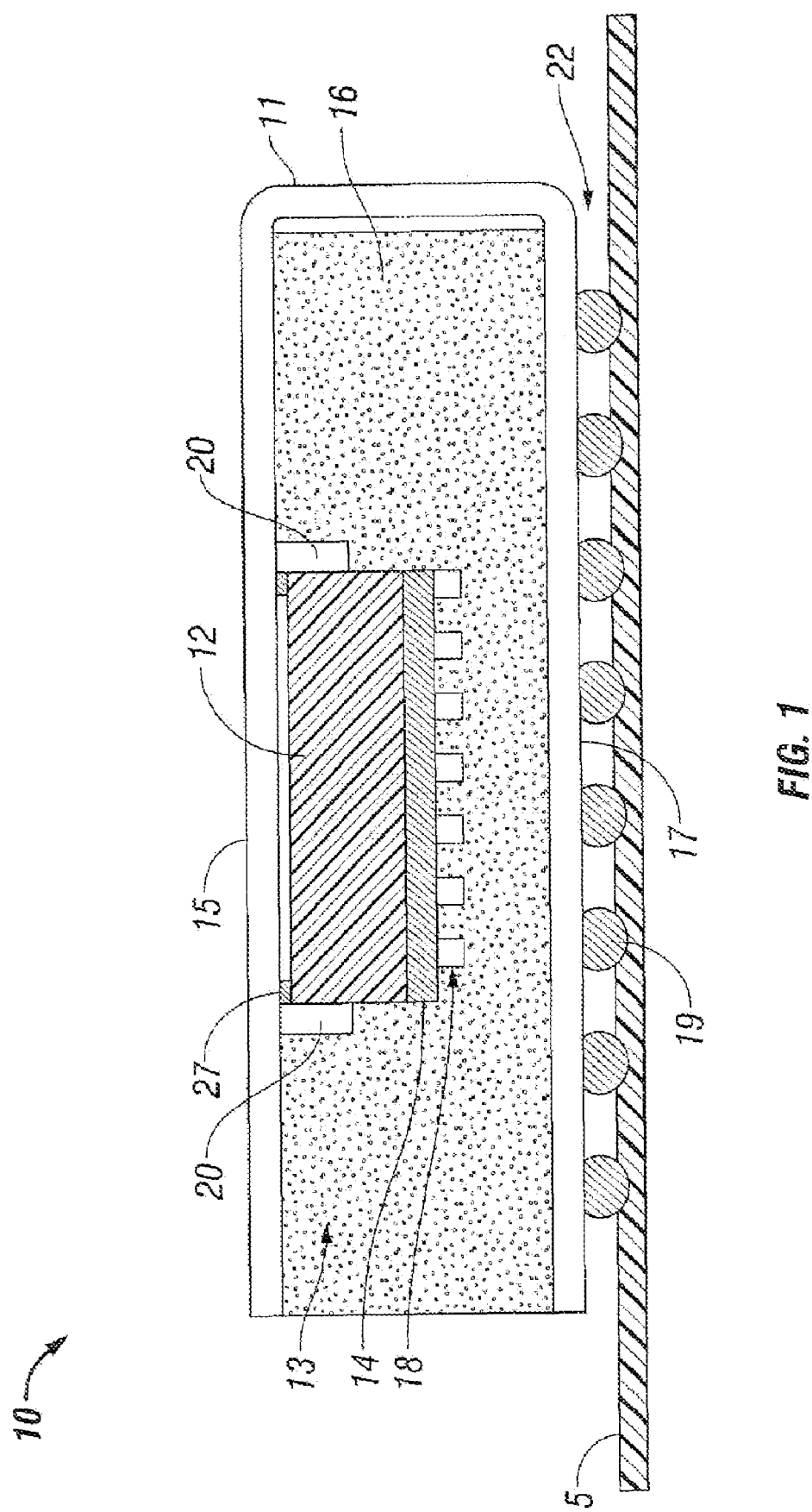
FIG. 1 depicts a circuit module according to one embodiment of the present invention.

FIG. 1 depicts a circuit module 10 according to one embodiment of the present invention. Circuit module 10 includes a flexible circuit 11 and a die 12 mounted on flexible circuit 11 so that it is exposed through a polyimide window along the top side 15 of flexible circuit 11. For example, die 12 may be a sensor chip with an exposed sensor array, where the array is exposed along the outside surface of an electrically-connected operating environment of circuit module 10, such as a consumer device. For instance, the circuit module 10 may employ die such as those used in the "FingerLoc® 8600" (AFS8600) manufactured by AuthenTec. In such a case, die 12 may be an exposed sensor module having a sensing area that comprises an RF fingerprint sensing array. Such a sensing area on die 12 could facilitate the process of counting ridges in a fingerprint.

Flexible circuit 11 may be bent to form an interior region 13. Flexible circuit 11 contains one or more conductive layers connected to a conductive footprint 22 expressed along the bottom side 17 of flexible circuit 11 (the downward-facing surfaces of flexible circuit 11). When bent in such a way, flexible circuit 11 may form a portion of the semiconductor package for die 12 while presenting the sensing area of die 12 to the outside of the housing. Sensor signals from die 12 are preferably transmitted through a metal free window portion of the flexible circuit. Other sensor transducers may be used.

In one embodiment, the entire circuit module 10 may be mounted as a ball grid array (BGA) device on the system board of a consumer device (e.g., fingerprint scanner). In other embodiments, circuit module 10 may be leaded or another kind of package. In yet other embodiments, circuit module 10 may use any other suitable type of surface-mounted packaging, such as that used for integrated circuits.

In some embodiments, die 12 may be mounted above a reinforcing layer 14, such as a metal (e.g., an iron-nickel alloy) reinforcement. Such a reinforcing layer 14 may be bonded to the back of die 12, serving to protect die 12 from bending or damages from other forces when pressure is applied to the top side 15 of die 12. The construction material for reinforcing layer 14 may be chosen to have a high modulus of elasticity (e.g., of at least about 25 giga-Pascals), a high tensile strength (e.g., of at least about 70 mega-Pascals) necessary for constructing, and a coefficient of thermal expansion matching that of die 12 sufficiently to prevent damage from different thermal expansion rates in the desired application (e.g., within 5%, but preferably an exact match or as close as possible, like within 1%). One preferred material is the Invar® nickel-iron alloy (FeNi36) which has a low coefficient of thermal expansion (CTE) in the range from room temperature up to 230° C. This alloy is has machinability similar to stainless steel and typically does not suffer from stress corrosion cracking. Other suitable alloys or non-metal reinforcing layers may be used, such as, for example, FeNi42. Such matching coefficients of thermal expansion can, for example, prevent thermal expansion stress faults in and between die 12 and reinforcing layer 14. Where a reinforcing layer is employed with gaps at the side of the die, the gaps may extend parallel to sides of the reinforcing layer as well, may terminate above the reinforcing layer as depicted, or terminate below the reinforcing layer.

Preferably, a portion or all of the sensing area of die 12 is protected by a polyimide window 23 (FIG. 2), or one or more layers of some other suitable high-performance protective film. For certain types of sensor arrays, such a layer is a metal-free zone to allow unobstructed sensing such as, for example, with reflected RF signals that pass through the polyimide layer without deleterious reflection or excessive attenuation.

Die 12 (plus its stacked reinforcing layer 14) may be mounted above a resilient low modulus material 16 to absorb loads applied to die 12. For example, having resilient low modulus material 16 with a lower elastic modulus than that of die 12 may help prevent damage to the die surface from excessive force applied to a small area of the die's surface.

In some embodiments, a gap pattern 18 may exist between the bottom of the reinforced die 12 and the resilient low modulus material 16. Gap pattern 18 may consist of voids shaped to provide bumps between the voids, or gap pattern 18 may consist of multiple ridges having voids in between, The gap pattern (or "patterned gap") may be formed of voids shaped to provide, between the voids, bumps that soften initial resistance of the low modulus material to downward compressive forces on the die. The bumps or the ridges (or other suitable shapes) may soften initial resistance of the low modulus material 16 to downward compressive forces on die 12, such as to provide an initial pressure relief when a force is applied to the exposed outer surface of die 12. While angular bums are shown, other bumps such as smoothly curved bumps or half-circles may be used. Gap pattern 18 may cover the entire bottom of the reinforced die 12, or the surface of the resilient low modulus material 16 may be patterned (with bumps, for example) so that initial displacement sees a soft force, and the force increases with additional displacement. Outside pressure initially compresses the flex against the surrounding resilient pad. The reinforced die 12 may be restrained from displacement only by the flexible circuit, the polyimide window thereof, and/or contact with any gap pattern 18 in the supporting the resilient low modulus material 16. Additional displacement may result in vertical support being supplied by contact with the bulk of the resilient low modulus material 16 below gap pattern 18.

The area around die 12 on the top side 15 of flexible circuit 11 may be substantially larger than the die area itself. In some embodiments, die 12 may be surrounded by gaps 20 between the edges of die 12 and the proximate edges of the resilient low modulus material 16. Such gaps 20 may reduce "peel force" when downward force is applied on the top surface of die 12. For example, gaps 20 may reduce the concentration of stresses along the edges of die 12 when forces on the top surface of die 12 would otherwise have the tendency to peel the flex away from the die.

The module 10 is depicted mounted to circuit board in operating environment 5 which is preferably consumer device or security device such as, for example, a laptop computer, personal digital assistant, mobile phone, access panel, or other such device. Other module mounting schemes may be employed, such as flexible circuit or circuits in which a module 10 is part of a larger circuit module, for example. The module preferably is housed to place the sensing area of the die along the outer surface or skin of the product, although some variants may have another covering, such as an access panel, above the sensor circuit module. Some devices have a security access system programmed to receive identifying data from a sensor on the circuit module and provide device access based on the identity or lack of an identifying match. Other devices may use the sensor data for other purposes.

Figure 2:
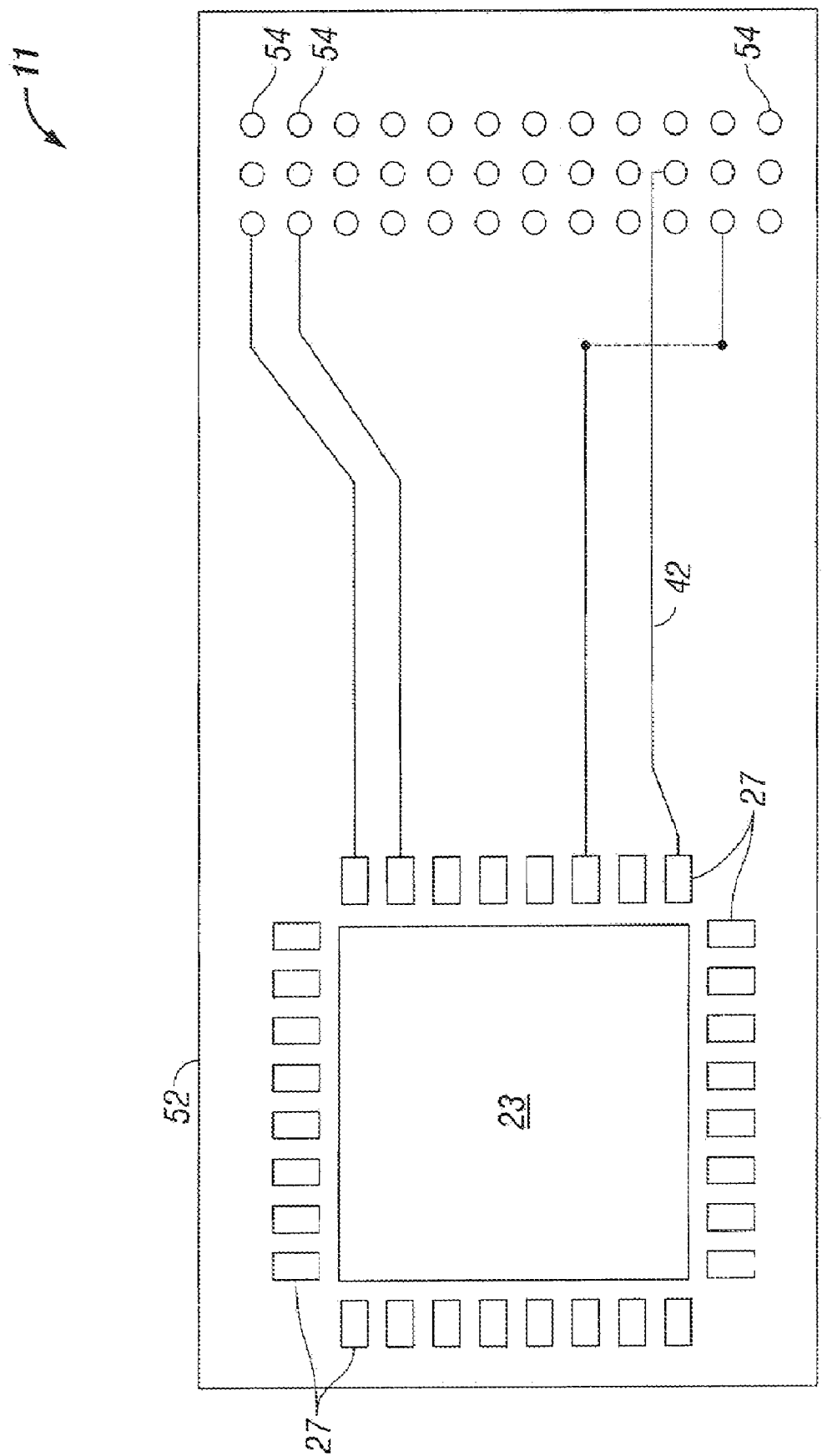
FIG. 2 depicts an exemplar layout of a conductive layer of the flexible circuit according, to one embodiment of the present invention.

FIG. 2 depicts an exemplar layout of a conductive layer 52 of flexible circuit 11 according to one embodiment of the present invention. The exemplar layout of conductive layer 52 depicted in FIG. 2 is shown from the side to which die 12 will be mounted. The layer is shown flat, but flexible circuit 11 may be bent when circuit module 10 is assembled. Specifically, flexible circuit 11 may be bent such that die 12 is presented underneath window portion 23 of the flexible circuit, with its sensor area oriented toward top side 15 of flexible circuit 11 externally exposed through a polyimide layer.

Referring to FIG. 2, in this embodiment conductive layer 52 has an array of gold contacts 27, which are preferably gold pads, arranged as four rows in a square for attaching with thermal compression to oppositely disposed contacts formed on die 12. Other embodiments may have a different arrangement of contacts 27, such as, for example, pads or bumps of copper, aluminum, or other suitable conductive metals. Gold pads are preferred, with corresponding gold bumps oppositely formed on the die for attachment. Those of skill will recognize that the one or more rows of contacts 27 may be referred to as an "array" or "footprint" for connecting a component, a flip-chip, or a bare die such as used herein. There may be other footprints expressed by conductive layer 52 for connecting additional components, such as additional arrangements of contacts 27 around each of multiple dies 12.

Depicted are exemplar traces 42 (e.g., made of copper) at the level of conductive layer 52. Traces 42 connect contacts 27 to flex contacts 54. The flexible circuit may have multiple conductive layers 52 with cross traces such as the depicted dotted-line trace 42 in FIG. 2. Flexible circuit construction is known in the art, and a variety of techniques may be employed to design the flex circuits described herein. For example, flexible circuit techniques are taught in U.S. patent application Ser. No. 10/435,192 by Roper, et al, which application is owned by the present assignee and is hereby incorporated by reference in its entirety for all purposes. Some embodiments may have a single conductive layer flex circuit. In some embodiments, flex contacts 54 may conductive pads for attaching a ball grid array 19 or some other type of surface-mount packaging interconnect used in integrated circuits, such as low profile contacts constructed with pads and/or rings that are connected with solder paste applications to appropriate connections. The flex contacts 54 shown here may be electrically connected to conductive footprint 27 of FIG. 1.

Inside of footprint 27 is depicted a polyimide "window" or metal free zone 23. Die 12 is preferably mounted to position its sensing array facing window 23 for optimum direction of sensors to acquire data through window 23. The die sensing area exposed, either underneath polyimide window 23 or protected in some other suitable manner, may be referred to as a sensor pad or sensor panel, depending, of course, on the number and type of sensors provided on the die sensing area and whether multiple die are employed. Further, while a die is taught, other suitable sensors or sensor arrays may be mounted using techniques described herein. A preferred embodiment uses a single die sensor having pixel sensor plates, an excitation signal reference plane, a semiconductor subtrate, and sense amps, or some other semiconductor-based fingerprint reader that uses small RF signals to detect the fingerprint ridge and valley pattern. Such RF sensor signals may be employed in some cases to improve detection accuracy through dirt, dead skin, or other contamination on the fingerprint surface.

Figure 3:
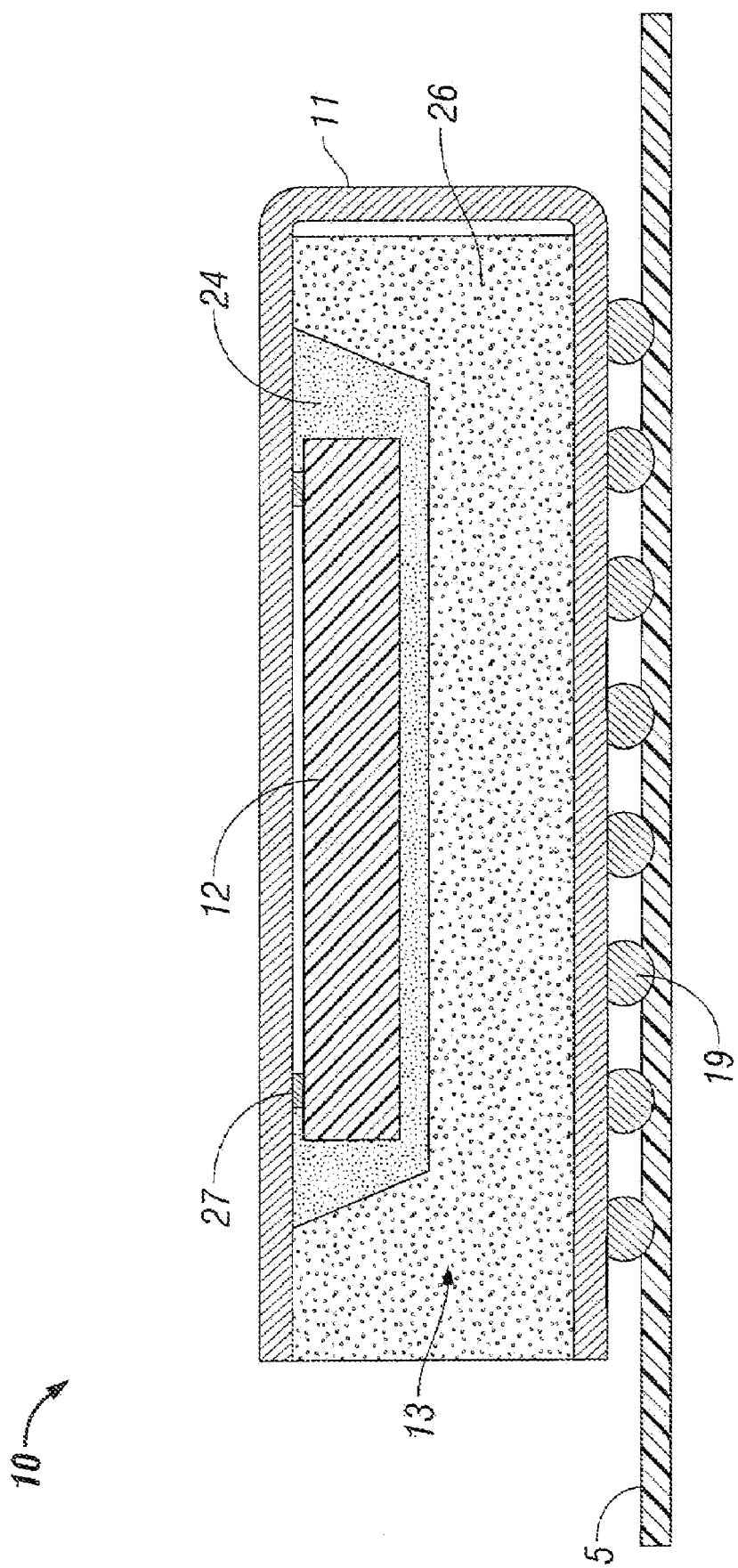
FIG. 3 depicts an alternate embodiment of the circuit module in which the die it contains is enclosed at least partially on five sides with a reinforcing layer.

FIG. 3 depicts an alternate embodiment of a circuit module 10 in which die 12 is enclosed at least partially around the bottom and 4 sides with a reinforcing layer 24. In this embodiment, reinforcing layer 24 includes a high modulus material disposed in interior region 13 of flexible circuit 11 covering the bottom surface and sides of die 12. The die may be provided with a reinforcing layer 14 (FIG. 1), which is also covered. For example, overmolding, potting, encapsulation, or some other suitable assembly method may be used for "ruggedizing" or protecting die 12 from exposure to water, dust, oil, chemicals, extreme temperature changes, and jostling. One embodiment employs a high-durometer silicone rubber compound. Other suitable materials may be used for high-modulus material 24 and low modulus material 26, and such materials may be selected based on their modulus and requirements such as expected pressure, size and thickness of the die, for example. Preferred embodiments need encapsulation materials that will withstand reflow temperatures for both tin lead solder and no lead solder so that module 10 may be reflow-mounted to a circuit board, for example, in its intended operating environment. Such a reinforcing layer 24 may extend about the bottom-surface and sides of die 12 in a manner sufficient to at least partially protect the die from flexural loads. This embodiment is similar to the embodiment depicted in FIG. 1, except reinforcing layer 24 here surrounds five sides of die 12, while reinforcing layer 14 of FIG. 1 is only along the bottom side of die 12.

Die 12 (plus its enclosing reinforcing layer 24) may further be mounted within low modulus material 26 that surrounds the reinforced die 12. The low modulus material 26 may be disposed in interior region 13 and about the high modulus material of reinforcing, layer 24 in a manner sufficient to at least partially absorb compressive loads applied to the die. For example, having low modulus material 26 with a lower modulus of elasticity than that of die 12 may help prevent damage to the die surface from excessive force applied to a small area of the die's surface. This allows the reinforced die 12 to "float" oil the low modulus material 26 within flexible circuit 11.

Other features described herein may be added to the design depicted in FIG. 3, such as certain features described in reference to FIG. 1. For example, circuit module 10 of FIG. 3 may also utilize gap pattern 18 (refer to FIG. 1) below die 12 (plus its reinforcing layer 24). Such a gap pattern 18 may provide an initial pressure relief when a force is applied to the exposed outer surface of die 12. In another example, the embodiment depicted in FIG. 3 may also utilize gaps 20 between the edges of die 12 (plus its reinforcing layer 24) and the proximate edges of the low modulus material 26. Such gaps 20 may reduce "peel force" in the presence of a downward force on the top surface of die 12.

Figure 4:
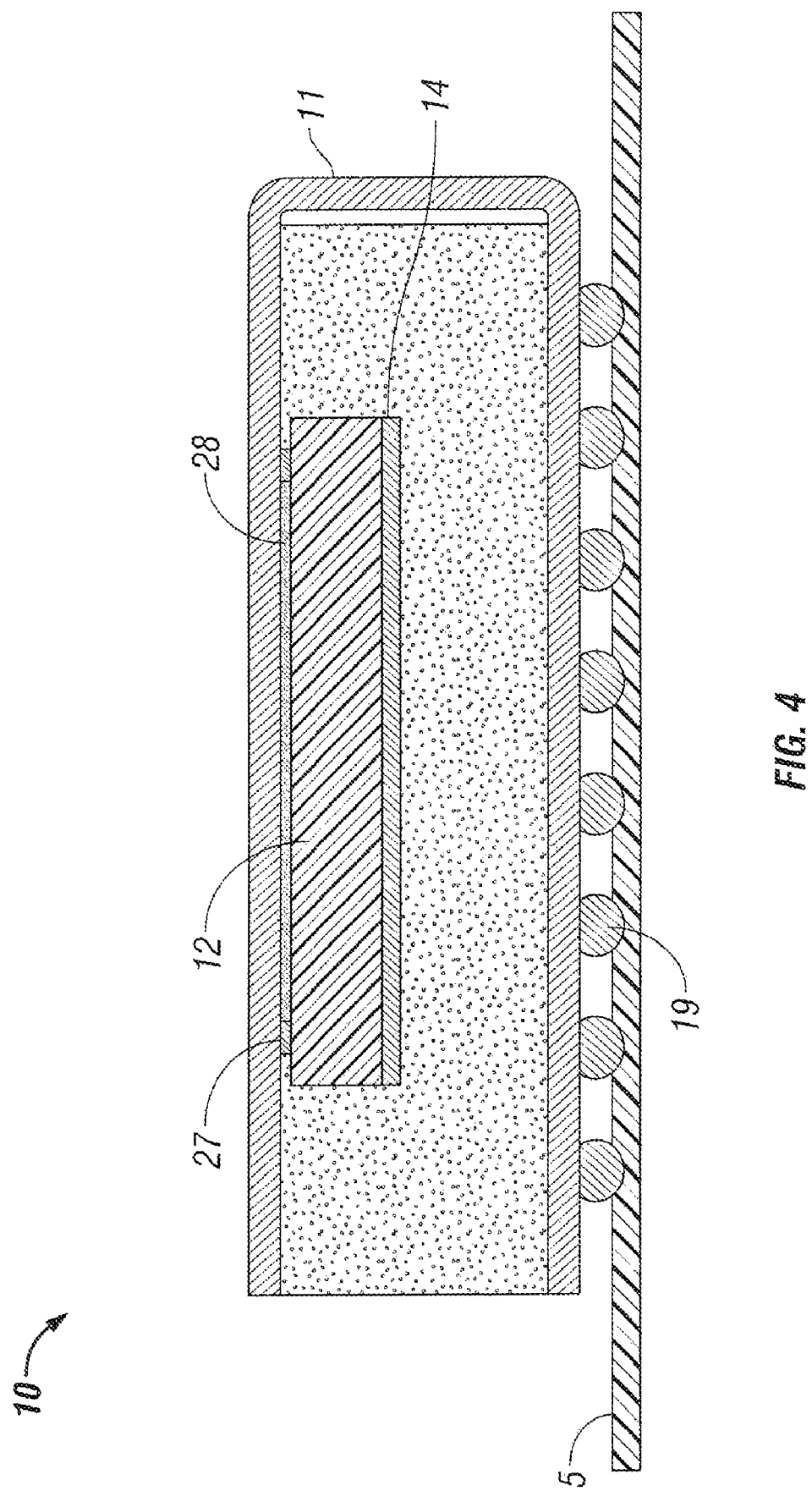
FIG. 4 depicts an alternate embodiment of the circuit module in which a dry film adhesive bonds at least part of the upper surface of the die to the flexible circuit.

FIG. 4 depicts an alternate embodiment of circuit module 10 in which a dry film adhesive 28 bonds at least part of the upper surface of die 12 to flexible circuit 11. Such a dry film adhesive 28 may be compressible and have a low modulus of elasticity, which can, for example, allow a force applied to the surface of the flexible circuit 11 to be transmitted to die 12 beneath it.

Other features herein may be added to circuit module 10 depicted in FIG. 4, such as certain features described in reference to FIGS. 1 and 3. For example, circuit module 10 of FIG. 4 may also utilize gap pattern 18 (FIG. 1) below die 12 (plus its reinforcing layer 24). In another example, the embodiment depicted in FIG. 4 may also utilize gaps 20 between the edges of die 12 (plus its reinforcing layer 24) and the proximate edges of the low modulus material 26. In another example, the embodiment depicted in FIG. 4 may also utilize a dry film adhesive 28 (FIG. 3) that bonds at least part of the upper surface of die 12 to flexible circuit 11.

Figure 5:
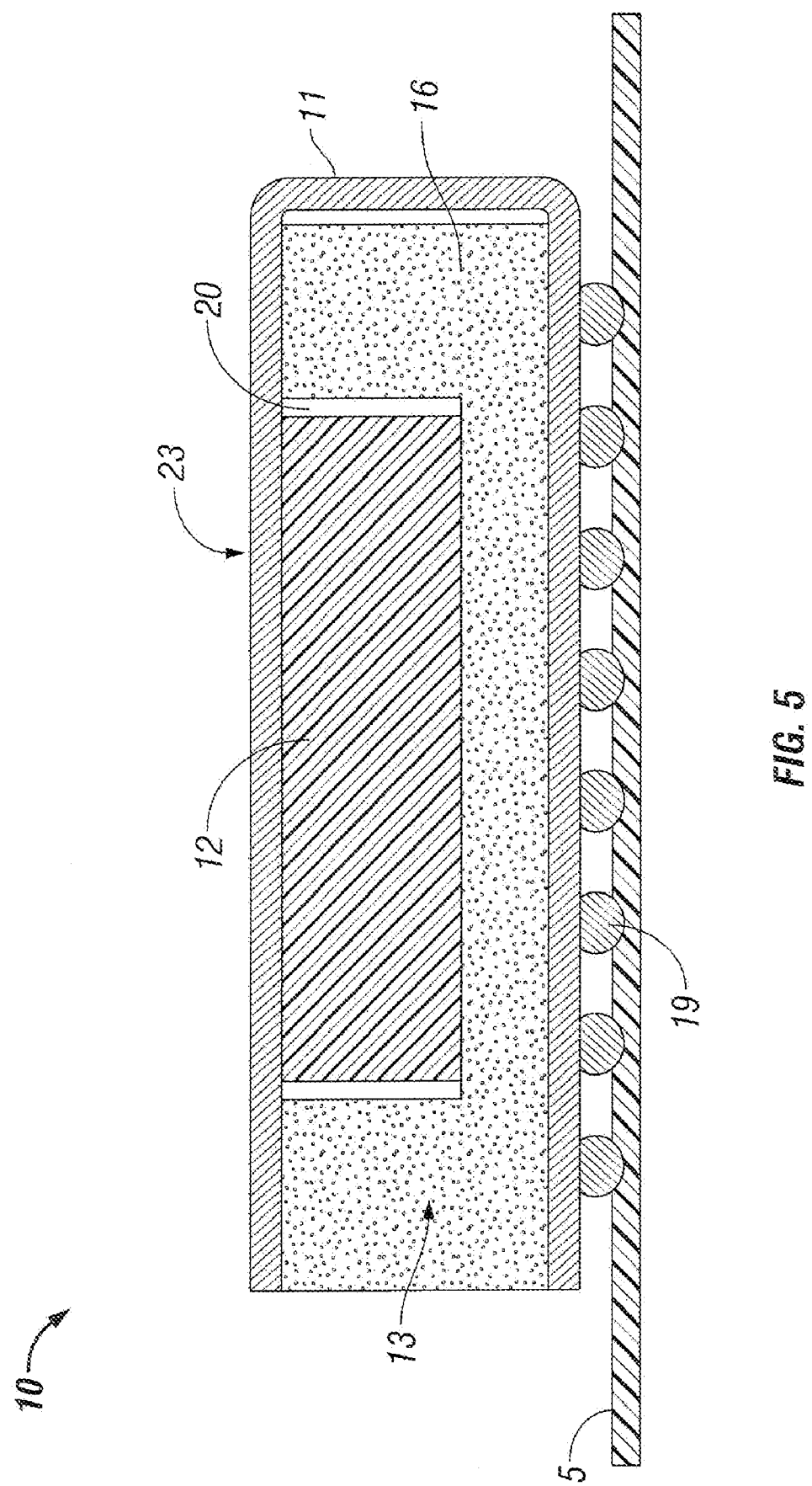
FIG. 5 is an enlarged view of gap construction feature according to another embodiment of the present invention.

FIG. 5 depicts exemplar peel force "gaps" 20 at the side edges of die 12 according to one embodiment of the present invention. For example, voids containing no material can exist between the edges of die 12 and the proximate edges of the resilient low modulus material 16. Such gaps 20 may reduce "peel force" in the presence of a downward force on the top surface of die 12. Gaps 20 may reduce the concentration of stresses along the edges of die 12 when forces on the top surface of die 12 would otherwise have the tendency to peel the polyimide window 23 Away from the die.

Figure 6:
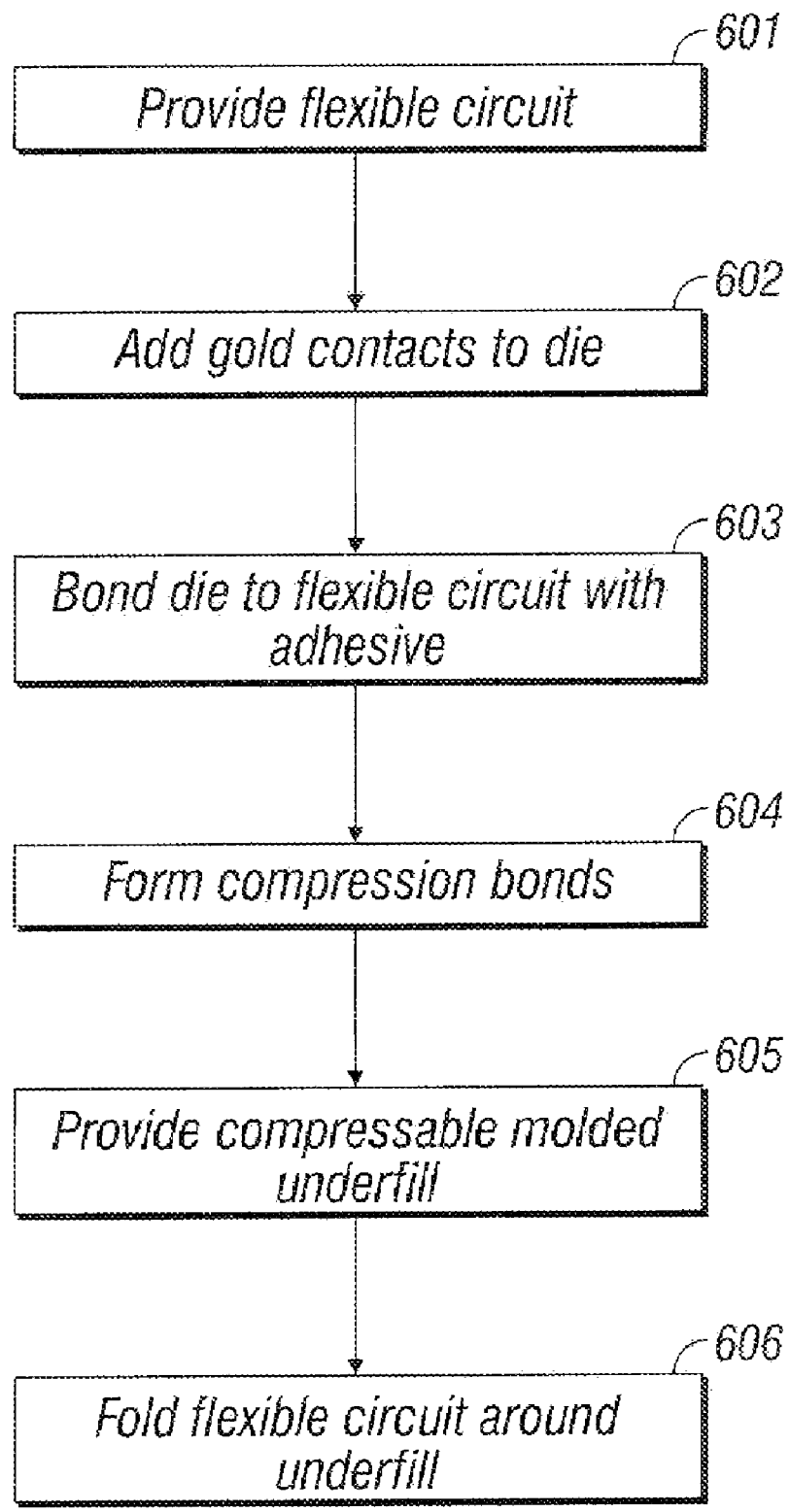
FIG. 6 is a flow chart of a process for making a circuit module according to one embodiment of the present invention.

FIG. 6 is a flow chart of a process for making a circuit module 10 according to another embodiment of the present invention. In this embodiment, a dry film adhesive 28 bonds at least part of the upper surface of die 12 to flexible circuit 11, such as that depicted in FIG. 4. Step 601 provides a flexible circuit 11 and a die. Step 602 adds gold contacts to flexible circuit 11 and the die. The die preferably has gold bumps whereas the flex circuit has gold pads, but bumps, built-up pads, or other suitable structures may also be formed on the flex circuit, or both. Step 603 bonds die 12 to flexible circuit 11 with dry film adhesive 28. Other adhesives such as liquid adhesives may be used. Preferable adhesives are thermal set, pressure sensitive adhesives. The adhesive is preferably applied to the flex circuit and then the die applied thereto, but the opposite arrangement may be employed as well. In step 604, compression bonds are formed along oppositely disposed contacts on flexible circuit 11. This may be done by known methods which typically involve heat and pressure applied over time to cause conductive metallic bonds to form. Step 605 provides a molded underfill form including the compressible low modulus material. Examples of the molded underfill are depicted in FIGS. 1, 3, 4 and 5 as low modulus material 16 and 26. Step 606 folds flexible circuit 11 into a shape about the molded underfill, such as that having top side 15 and bottom side 17. Other embodiments may, of course, use other shapes for flexible circuit 11 than that depicted in FIG. 4. This can serve to protect die 12 within flexible circuit 11.

Figure 7:
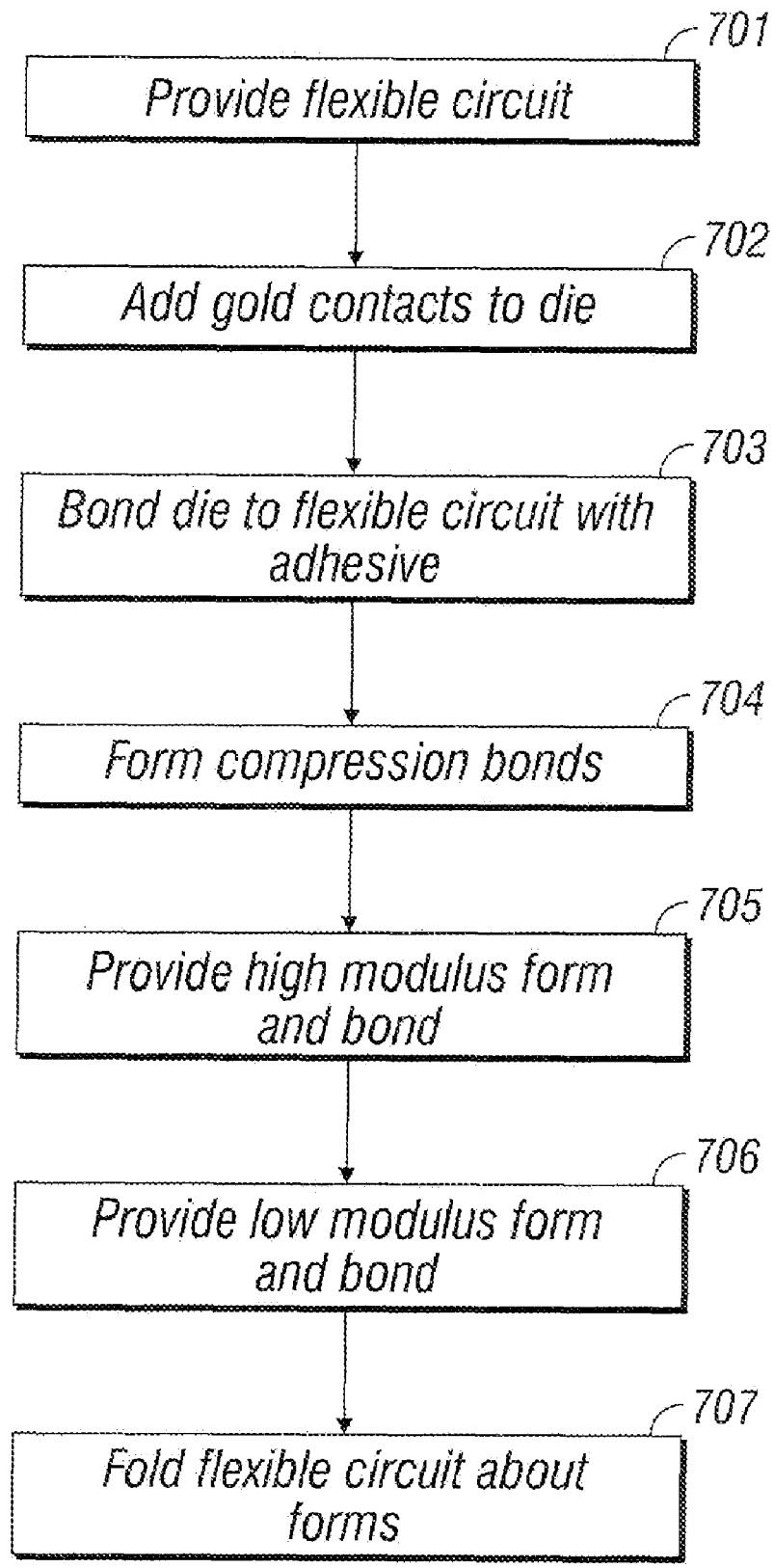
FIG. 7 is a flow chart of a construction process according to another embodiment of the present invention.

FIG. 7. is a flow chart of a process for making a circuit module according to another embodiment of the present invention. In this embodiment, die 12 is enclosed at least partially on five sides with a reinforcing layer 24, such as that depicted in FIG. 3. Step 701 provides a flexible circuit 11. Step 702 adds gold contacts to the die, preferably as bumps. Step 703 bonds die 12 to flexible circuit 11 with an adhesive. In step 704, compression bonds are formed between gold contacts on the die and oppositely disposed contacts on flexible circuit 11. In step 705, reinforcing layer 24 is provided preferably as a molded form of high modulus material. The form is preferably bonded to the die, which may be reinforced, and the flex circuit. Such high modulus material may cover the bottom surface and sides of die 12, serving to at least partially protect die 12 from flexural loads. In step 706, low modulus material 26 is provided preferably as a molded form and bonded below reinforcing layer 24. The low modulus for is provided such that, after flex circuit folding, it will fill part or all of interior region 13 of flexible circuit 11. This allows the reinforced die 12 to "float" on the low modulus material 26 within flexible circuit 11. Step 707 folds flexible circuit 11 into shape about the two forms, thus, in this embodiment, building the depicted module in FIG. 3. The flex circuit it preferably attached to the forms with adhesive.

Figure 8:
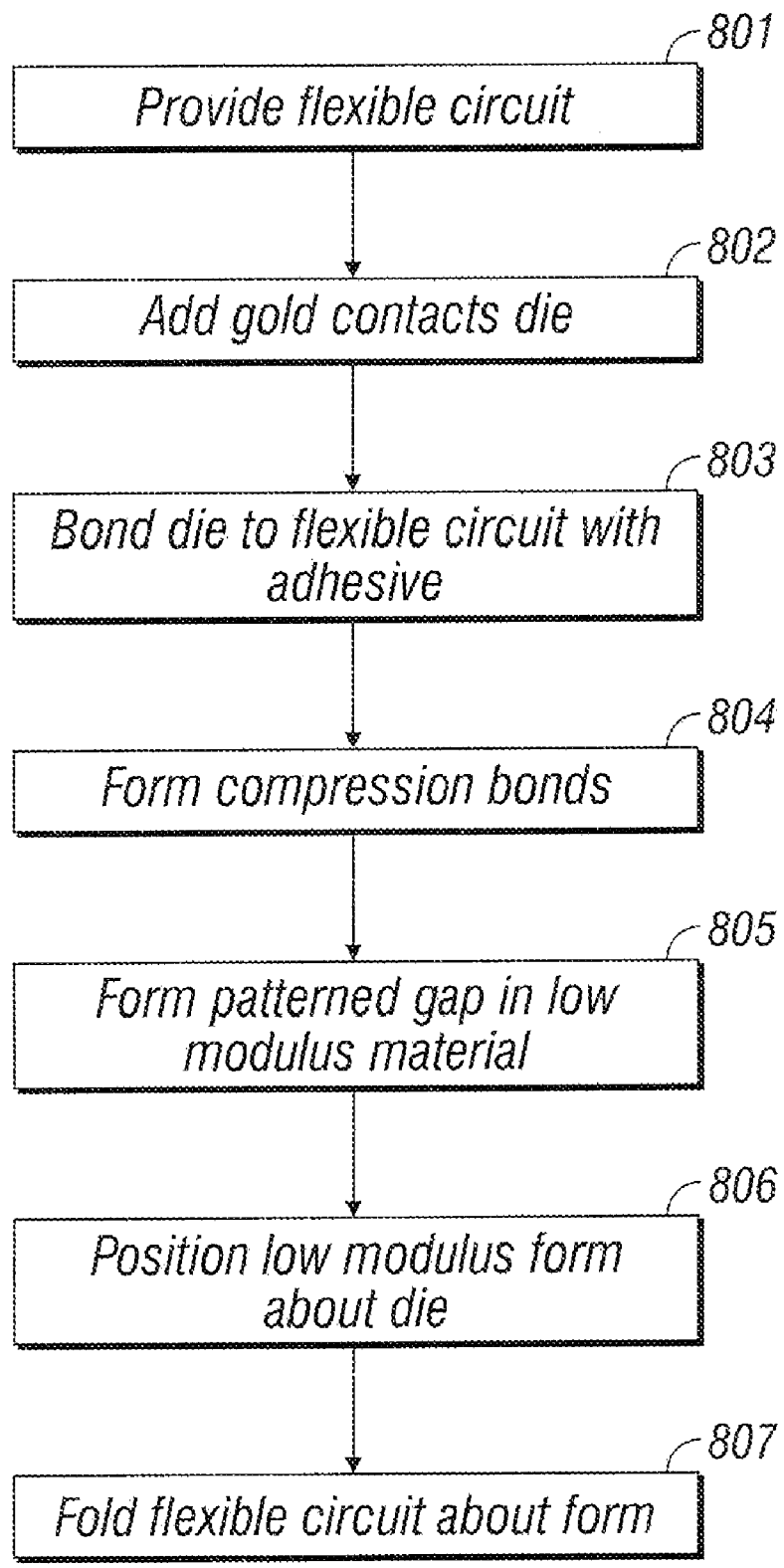
FIG. 8 is a flow chart of a construction process according to another embodiment of the present invention.

FIG. 8 is a flow chart of a process for making a circuit module 10 according to another embodiment of the present invention. In this embodiment, a gap pattern 18 exists between the bottom of the reinforced die 12 and the resilient low modulus material 16, such as that depicted in FIG. 1. Step 801 provides a flexible circuit 11. Step 802 adds gold contacts to die such that they will oppositely match gold pads on the flexible circuit for compression bonding. Step 803 bonds die 12 to flexible circuit 11 with an adhesive. In step 804, compression bonds between gold contacts on die 12 and oppositely disposed gold contacts on flexible circuit 11. In step 805, gap pattern 18 is formed, or otherwise added, in a low modulus material molded form, preferably made as part of the molding process. In step 806, low modulus material 16 is provided, preferably as a molded form which is adhesively fixed to flexible circuit 11 in the area on flexible circuit 11 that, when folded, is below reinforcing layer 14. The low modulus material 16 is formed in sufficient quantities such that interior region 13 is mostly filled with low modulus material when flexible circuit 11 is folded. Step 807 folds flexible circuit 11 into a shape and preferably fixes it to the form with adhesive, such as that having top side 15 and bottom side 17.

While this specification describes several embodiments, these should not be construed as limitations on the scope of the invention or of what may be claimed. Certain features that are described in this specification in the context of separate embodiments can also be implemented in combination in a single embodiment. Conversely, various features that are described in the context of a single embodiment can also be implemented in multiple embodiments separately or in any suitable subcombination. Similarly, while operations are depicted in the drawings in a particular order, this should not be understood as requiring that such operations be performed in the particular order shown or in sequential order, or that all illustrated operations be performed, to achieve desirable results.

What is claimed is:

1. A circuit module including:
   a flexible circuit having a first side and a second side, and one or more conductive layers, a conductive footprint expressed along the first side, the flexible circuit being bent to form an interior region;
   a die electrically connected to the conductive footprint, the die having a top surface with a sensing area, a bottom surface, multiple sides, and a die coefficient of thermal expansion;
   resilient low modulus material at least partially filling the interior region of the flexible circuit, the low modulus material disposed about the bottom surface and sides of the die in a manner sufficient to at least partially absorb compressive loads from the die, a gap formed by at least one side of the die and a proximate edge of the low modulus material.

2. The circuit module of claim 1 further comprising a gap between all sides of the die and the low modulus material, the gaps formed by respective sides of the die and proximate edges of the low modulus material.

3. The circuit module of claim 1 further comprising a reinforcing layer bonded to the back side of the die, the reinforcing layer having a coefficient of thermal expansion within 5% of the die coefficient of thermal expansion, the reinforcing layer having a high modulus of elasticity and a high tensile strength.

4. The circuit module of claim 1 further comprising a reinforcing layer bonded to the back side of the die, the reinforcing layer having a coefficient of thermal expansion matching the die coefficient of thermal expansion sufficiently to prevent thermal expansion stress faults, the reinforcing layer having a high tensile strength.

5. The circuit module of claim 4 in which the reinforcing layer is comprised of a metal.

6. The circuit module of claim 1 further comprising a dry film adhesive bonding at least part of the upper surface of the die to the flexible circuit.

7. The circuit module of claim 6 in which the dry film adhesive is compressible and has a low modulus of elasticity.

8. The circuit module of claim 1 further comprising a patterned gap formed in the low modulus material under the bottom surface of the die.

9. The circuit module of claim 8 in which the patterned gap comprises voids shaped to provide, between the voids, bumps that soften initial resistance of the low modulus material to downward compressive forces on the die.

10. The circuit module of claim 8 in which the patterned gap comprises multiple ridges with voids formed therebetween.

11. The circuit module of claim 1 in which the sensing area comprises an RF fingerprint sensing array.

12. An electronic device comprising housing and a module according to claim 1, in which the module is coupled to a circuit interior to the housing, and the sensing area is presented outside of the housing being covered by a portion of the flexible circuit.

13. A circuit module comprising:
   a flexible circuit having a first side and a second side, and one or more conductive layers, and a conductive footprint expressed along the first side, the flexible circuit being bent to form an interior region;
   a die electrically connected to the conductive footprint, the die having a top surface with a sensing area, a bottom surface, multiple sides, and a die coefficient of thermal expansion;
   a reinforcing layer bonded to the back side of the die, the reinforcing layer having a coefficient of thermal expansion within 5% of the die coefficient of thermal expansion, the reinforcing layer having a high modulus of elasticity and a high tensile strength.

14. The circuit module of claim 13 further comprising resilient low modulus material at least partially filling the interior region of the flexible circuit, the low modulus material disposed about the bottom surface and sides of the die in a manner sufficient to at least partially absorb compressive loads from the die.

15. The circuit module of claim 14 further comprising a gap between the sides of the die and the resilient low modulus material.

16. The circuit module of claim 13 further comprising:
   high modulus material disposed about the bottom surface and sides of the die in a manner sufficient to at least partially protect the die from flexural loads;
   low modulus material disposed about the high modulus material in a manner sufficient to at least partially absorb compressive loads applied to the die.

17. The circuit module of claim 16 further comprising a gap between the sides of the die and the high modulus material.

18. The circuit module of claim 13 further comprising a dry film adhesive bonding at least part of the upper surface of the die to the flexible circuit.

19. The circuit module of claim 13 in which the reinforcing layer has a modulus of elasticity of at least about 100 gigaPascals.

20. The circuit module of claim 13 in which the flexible circuit comprises a metal-free zone disposed to cover the sensing area of the die.

21. The circuit module of claim 13 in which the flexible circuit provides a polyimide window disposed to cover at least a portion of the sensing area of the die.

22. The circuit module of claim 13 in which the reinforcing layer has a tensile strength of at least about 100 mega-Pascals.

23. The circuit module of claim 13 in which the flexible circuit further comprises an array of module contacts for electrically connecting the circuit module to an operating environment.

24. An electronic device comprising housing and a circuit module according to claim 13, in which the circuit module is coupled to a circuit interior to the housing, and the sensing area is presented outside of the housing being covered by a portion of the flexible circuit.

25. A circuit module including:
   a flexible circuit;
   a die electrically coupled to a conductive footprint, the die having a top surface with a sensing area, a bottom surface and multiple sides;
   high modulus material disposed the bottom surface and sides of the die in a manner sufficient to at least partially protect the die from flexural loads;
   low modulus material disposed in an interior region and about the high modulus material in a manner sufficient to at least partially absorb compressive loads applied to the die.

26. The circuit module of claim 25 further comprising gaps between the sides of the die and the high modulus material, the gaps formed by respective sides of the die and proximate edges of the high modulus material.

27. The circuit module of claim 25 further comprising a reinforcing layer bonded to the back side of the die, the reinforcing layer having a coefficient of thermal expansion within 5% of the die coefficient of thermal expansion, the reinforcing layer having a high modulus of elasticity and a high tensile strength.

28. The circuit module of claim 25 further comprising a reinforcing layer bonded to the back side of the die, the reinforcing layer having a coefficient of thermal expansion matching the die coefficient of thermal expansion sufficiently to prevent thermal expansion stress faults, the reinforcing layer having a high tensile strength relative to that of the die.

29. The circuit module of claim 25 further comprising a dry film adhesive bonding at least part of the upper surface of the die to the flexible circuit.

30. The circuit module of claim 25 in which the sensing area comprises an RF fingerprint sensing array.

31. An electronic device comprising housing and a circuit module according to claim 25, in which the circuit module is coupled to a circuit interior to the housing, and the sensing area is presented outside of the housing being covered by a portion of the flexible circuit.

32. A circuit module including:
   a flexible circuit having a first side and a second side, and one or more conductive layers, a conductive footprint expressed along the first side, the flexible circuit being bent to form an interior region;
   a die electrically connected to the conductive footprint, the die having a top surface with a sensing area, a bottom surface, multiple sides, and a die coefficient of thermal expansion;
   resilient low modulus material at least partially filling the interior region of the flexible circuit, the low modulus material disposed about the bottom surface and sides of the die in a manner sufficient to at least partially absorb compressive loads from the die, the low modulus comprising a patterned gap formed in the low modulus material under the bottom surface or the die.

33. The circuit module of claim 32 in which the patterned gap comprises voids shaped to provide, between the voids, bumps that soften initial resistance of the low modulus material to downward compressive forces on the die.

34. The circuit module of claim 32 in which the patterned gap comprises multiple ridges with voids formed therebetween.

35. The circuit module of claim 32 further comprising a gap between all sides of the die and the low modulus material, the gaps formed by respective sides of the die and proximate edges of the low modulus material.

36. The circuit module of claim 32 further comprising a reinforcing layer bonded to the back side of the die, the reinforcing layer having a coefficient of thermal expansion within 5% of the die coefficient of thermal expansion, the reinforcing layer having a high modulus of elasticity and a high tensile strength.

37. The circuit module of claim 32 further comprising a reinforcing layer bonded to the back side of the die, the reinforcing layer having a coefficient of thermal expansion matching the die coefficient of thermal expansion sufficiently to prevent thermal expansion stress faults, the reinforcing layer having a high tensile strength.

38. The circuit module of claim 37 in which the reinforcing layer is comprised of a metal.

39. The circuit module of claim 32 further comprising a dry film adhesive between at least part of the upper surface of the die to the flexible circuit.

40. The circuit module of claim 39 in which the dry film adhesive is compressible and has a low modulus of elasticity.

41. The circuit module of claim 32 in which the sensing area comprises an RF fingerprint sensing array.

42. An electronic device comprising housing and a module according to claim 32, in which the module is coupled to a circuit interior to the housing, and the sensing area is presented outside of the housing being covered by a portion of the flexible circuit.

43. An electronic device comprising housing and a circuit module according to claim 32, in which the circuit module is coupled to a circuit interior to the housing, and the sensing area is presented outside of the housing being covered by a portion of the flexible circuit.

* * * * *